United States Patent
Leutschacher et al.

(10) Patent No.: US 10,073,133 B2
(45) Date of Patent: Sep. 11, 2018

(54) CURRENT DISTRIBUTION DEVICE PROTECTED AGAINST OVER-VOLTAGE CONDITIONS

(71) Applicant: Infineon Technologies AG, Neubiberg (DE)

(72) Inventors: Michael Leutschacher, Finkenstein (AT); Walter Slamnig, Latschach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/482,273

(22) Filed: Apr. 7, 2017

(65) Prior Publication Data

US 2017/0292987 A1 Oct. 12, 2017

(30) Foreign Application Priority Data

Apr. 8, 2016 (DE) .................. 10 2016 106 490

(51) Int. Cl.
| | |
|---|---|
| G01R 31/00 | (2006.01) |
| G01R 31/28 | (2006.01) |
| G01R 1/067 | (2006.01) |
| G01R 1/073 | (2006.01) |
| H02H 9/04 | (2006.01) |
| H02M 3/04 | (2006.01) |

(52) U.S. Cl.
CPC .......... *G01R 31/28* (2013.01); *G01R 1/06711* (2013.01); *G01R 1/07307* (2013.01); *H02H 9/04* (2013.01); *H02M 3/04* (2013.01)

(58) Field of Classification Search
CPC ............ G01R 31/31924; G01R 1/0425; G01R 1/07314; G01R 31/2851
See application file for complete search history.

(56) References Cited

U.S. PATENT DOCUMENTS

| | | | |
|---|---|---|---|
| 5,637,990 A | 6/1997 | Kato et al. | |
| 6,441,637 B1 | 8/2002 | Neeb | |
| 7,295,021 B2 | 11/2007 | Gaggl | |
| 2013/0258733 A1* | 10/2013 | Zhang | H02J 3/36 363/127 |
| 2014/0029150 A1 | 1/2014 | Fledell et al. | |
| 2015/0229202 A1* | 8/2015 | Varigonda | H02M 1/32 323/282 |
| 2016/0336867 A1* | 11/2016 | Nystrom | H02M 3/33592 |

FOREIGN PATENT DOCUMENTS

| | | |
|---|---|---|
| DE | 3785398 T2 | 7/1993 |
| DE | 10202904 A1 | 9/2003 |
| EP | 0590221 A1 | 4/1994 |
| EP | 1577676 A1 | 9/2005 |
| EP | 1061374 B1 | 4/2006 |

* cited by examiner

*Primary Examiner* — Tung X Nguyen
(74) *Attorney, Agent, or Firm* — Murphy, Bilak & Homiller, PLLC

(57) ABSTRACT

An electronic device for testing of semiconductor components with test needles includes an electric power source, a plurality of test needles connected with the electric power source, a plurality of electric circuits, each one of the electric circuits connected upstream of one of the test needles, each one of the electric circuits including at least one circuit component which has low resistance in a range of electric currents and has high resistance above a given limit electric current, a control voltage source connected with each one of the electric circuits, and two DC/DC converter circuits connected between the control voltage source and the electric circuits.

17 Claims, 3 Drawing Sheets

CURRENT DISTRIBUTION DEVICE PROTECTED AGAINST OVER-VOLTAGE CONDITIONS

TECHNICAL FIELD

The present disclosure relates in general to an electronic device for distributing electric current to a plurality of current paths, and in particular to an electronic device for testing of semiconductor components with test needles, and in particular to a test apparatus for testing of semiconductor components. The present disclosure relates also to the protection of such devices or apparatuses against surge and over-voltage conditions.

BACKGROUND

When electric current is distributed to a plurality of current paths, it is often necessary to supply an equal magnitude of electric current to each one of the current paths. An example of an electronic device for distributing electric current to a plurality of current paths is an electronic device for testing of semiconductor components with test needles or a test apparatus for testing of semiconductor components with test needles, wherein the test needles represent the current paths and are to be connected on one end with an electric power source and on the other end with electrical contact pads of the semiconductor component. Another example of an electronic device for distributing electric current to a plurality of current paths, relates to the field of lighting technology in which it may become necessary to supply an equal magnitude of electric current to a plurality of light emitting diodes to allow them to emit light of equal light intensities. In all these different examples of distributing electric current to a plurality of current paths, it may thus become necessary to implement additional devices or circuits for equally distributing the electric current to the current paths. It may further become necessary to protect these additional devices or circuits against conditions in which high magnitudes of voltage or current are to be applied to the plurality of current paths.

SUMMARY

In accordance with a first aspect of the disclosure, an electronic device for distributing electric current to a plurality of current paths comprises an electric, power source, at least one electric line connected with the electric power source, at least one electric circuit connected upstream of the at least one electric line, the electric circuit comprising at least one circuit component which has low resistance in a range of electric currents and has high resistance above a given limit electric current, and a control voltage source connected with the at least one electric circuit, and a first DC/DC converter circuit and a second DC/DC converter circuit, wherein the first DC/DC converter circuit is connected between the control voltage source and the second DC/DC converter circuit, and the second DC/DC converter circuit is connected between the first DC/DC converter circuit and the at least one electric circuit.

In accordance with a second aspect of the disclosure, an electronic device for testing of semiconductor components with test needles comprises an electric power source, a plurality of test needles connected with the electric power source, a plurality of electric circuits, each one of the electric circuits connected upstream of one of the test needles, each one of the electric circuits comprising at least one transistor, and a control voltage source connected with each one of the electric circuits, and two DC/DC converter circuits connected between the control voltage source and the electric circuits.

In accordance with a third aspect of the disclosure, a test apparatus for testing of semiconductor components comprises a carrier for supporting a semiconductor component to be tested, an electric power source, a plurality of test needles connected with the electric power source, a plurality of electric circuits, each one of the electric circuits connected upstream of one of the test needles, each one of the electric circuits comprising at least one transistor, and a control voltage source connected with each one of the electric circuits, and two DC/DC converter circuits connected between the control voltage source and the electric circuits.

In accordance with a forth aspect of the disclosure, an electronic device for distributing electric current to a plurality of current paths of a test apparatus for testing semiconductor components comprises an electric power source, at least one electric line connected with the electric power source, at least one electric circuit connected upstream of the at least one electric line, the electric circuit comprising at least one circuit component which has low resistance in a range of electric currents and has high resistance above a given limit electric current, and a control voltage source connected with the at least one electric circuit, and a DC/DC converter circuit, wherein the DC/DC converter circuit is connected between the control voltage source and the at least one electric circuit, wherein an adjustable resistor is connected between the DC/DC converter circuit and the at least one electric circuit.

The person skilled in the art recognizes additional features and advantages upon reading the following detailed description and upon giving consideration to the accompanying drawings.

BRIEF DESCRIPTION OF THE DRAWINGS

The accompanying drawings are included to provide a further understanding of examples and are incorporated in and constitute a part of this specification. The drawings illustrate examples and together with the description serve to explain principles of examples. Other examples and many of the intended advantages of examples will be readily appreciated as they become better understood by reference to the following detailed description.

The elements of the drawings are not necessarily to scale relative to each other. Like reference numerals designate corresponding similar parts.

DETAILED DESCRIPTION

Figure 1:
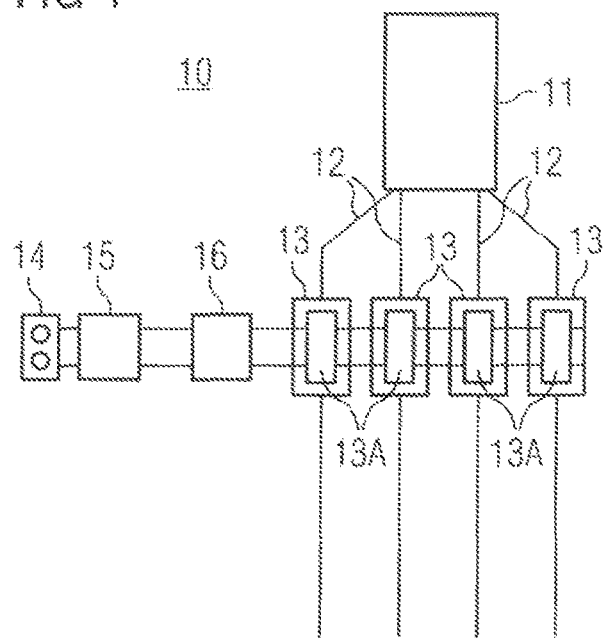
FIG. 1 shows a schematic representation of an electronic device for distributing electric current to a plurality of current paths according to the first aspect.

The aspects and examples are now described with reference to the drawings, wherein like reference numerals are generally utilized to refer to like elements throughout. In the following description, for purposes of explanation, numerous specific details are set forth in order to provide a thorough understanding of one or more aspects of the examples. It may be evident, however, to one skilled the art that one or more aspects of the examples may be practiced with a lesser degree of the specific details. In other instances, known structures and elements are shown in schematic form in order to facilitate describing one or more aspects of the examples. It is to be understood that other examples may be utilized and structural or logical changes may be made without departing from the scope of the present disclosure. It should be noted further that the drawings are not to scale or not necessarily to scale.

In the following detailed description, reference is made to the accompanying drawings, which form a part hereof, and in which is shown by way of illustration specific aspects in which the disclosure may be practiced. In this regard, directional terminology, such as "top", "bottom", "front", "back" etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present disclosure. The following detailed description, therefore, is not to be taken in a limiting sense, and the scope of the present disclosure is defined by the appended claims.

In addition, while a particular feature or aspect of an example may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present disclosure is defined by the appended claims.

An electronic device for testing of semiconductor components test needles may be used for testing various types of semiconductor components, semiconductor chips or semiconductor chip modules or circuits incorporated in the semiconductor chips, among them logic integrated circuits, analog integrated circuits, mixed signal integrated circuits, sensor circuits, MEMS (micro-electro-mechanical-systems), power integrated circuits, chips with integrated passives, etc. The electronic device for testing of semiconductor components may also be used for the testing of semiconductor chips comprising MOS transistor structures or vertical transistor structures like, for example, IGBT (insulated gate bipolar transistor) structures or, in general, transistor or other structures or device in which at least one electrical contact pad is arranged on a first main face of the semiconductor chip and at least one other electrical contact pad is arranged on a second main face of the semiconductor chip opposite to the first main face of the semiconductor chip.

FIG. 1 shows a schematic representation of an electronic device 10 for distributing electric current to a plurality of current paths according to the first aspect. The electronic device 10 of FIG. 1 comprises an electric power source 11, at least one electric line 12 connected with the electric power source 11, and at least one electric circuit 13 connected upstream of the at least one electric line 12, the electric circuit 13 having at least one circuit component 13A which has low resistance in a range of electric currents and has high resistance above a given limit electric current. The electronic device 10 of FIG. 1 further comprises a control voltage source 14 connected with the at least one electric circuit 13, and a first DC/DC converter circuit 15 and a second DC/DC converter circuit 16, wherein the first DC/DC converter circuit 15 is connected between the control voltage source 14 and the second DC/DC converter circuit 16, and the second DC/DC converter circuit 16 is connected between the first DC/DC converter circuit 15 and the at least one electric circuit 13. The at least one electric circuit 13 can also be called current limiter (CL) circuit.

According to an example of the electronic device of the first aspect, the electronic device 10 can be configured as an electronic device for testing of semiconductor components with test needles in which case the test needles form the current paths. According to an example thereof, the at least one electric line comprises a test needle configured to be placed onto an electrical contact pad of a semiconductor component. According to a further example thereof, the electronic device further comprises a probe card or a needle card, either one comprising a plurality of test needles in an arrangement geometrically matched to an arrangement of electrical contact pads of the semiconductor component. An example thereof will be illustrated and explained further below.

According to an example of the electronic device of the first aspect, the electric power source 11 is either one of a voltage source or a current source. It is also possible to provide both a voltage source and a current source and to connect both of them via a switch to the at least one electric line. An example thereof will be illustrated and explained further below.

According to an example of the electronic device of the first aspect, the at least one circuit component 13A is a transistor, in particular a MOSFET transistor and that the second DC/DC converter is connected with the control terminals, in particular the gate terminals, of the transistors. According to an example thereof, the limit electric current is determined by the saturation of a drain current of the MOSFET transistor. Accordingly, this example uses the property of MOSFET transistors that, depending on the control voltage between the gate and source, saturation of the source-drain current occurs almost independently of the voltage on the source-drain path. Accordingly, in the so-called on-state region for electric currents below the limit electric current, an only small voltage drop occurs on the source-drain path. The MOSFET transistor is exposed to a control voltage so that its characteristic is fixed such that the transistor in the range of allowable measurement currents is in the on-state region and the test arrangement is not significantly influenced by the then only small voltage drop. If the current exceed the allowable value, it is limited by the MOSFET transistor which is now in the saturation current range. The control voltage source 14 is galvanically separated from the at least one electric circuit 13 by means of the first and second DC/DC converter circuits 15 and 16. An example will be shown and explained in greater detail further below.

According to a further example, a diode is connected in parallel to the MOSFET transistor.

According to an example of the electronic device of the first aspect, the at least one circuit component comprises precisely one MOSFET transistor connected upstream of the at least one electric line.

According to an example of the electronic device of the first aspect, the at least one circuit component comprises precisely two MOSFET transistors connected in series upstream of the at least one electric line. An example thereof will be illustrated and explained in connection with FIG. 2.

According to an example of the electronic device of the first aspect, an adjustable resistor is connected between the second DC/DC converter and the at least one circuit component. In particular, in the case of a MOSFET transistor as the circuit component, the adjustable resistor is connected between the second DC/DC converter and the gate terminal of the MOSFET transistor.

Figure 2:
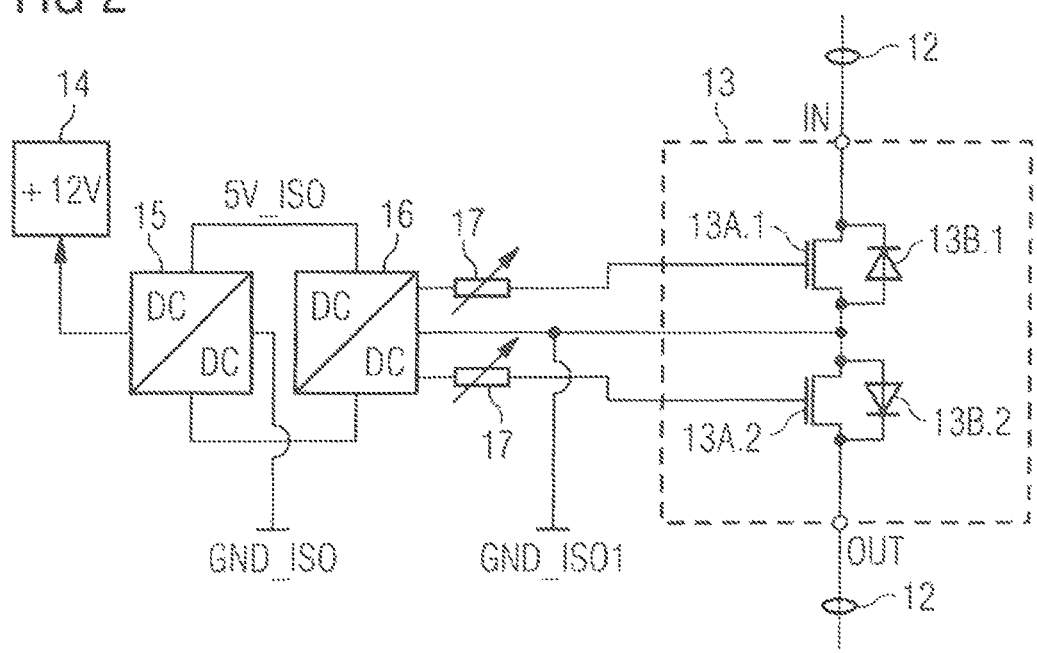
FIG. 2 shows a schematic circuit representation of the two cascaded DC/DC converters connected with the electric circuit which is connected upstream of the at least one electric line.

FIG. 2 shows a schematic circuit diagram of a current limiter 13 according to an example. The current limiter 13 as shown on the right side of FIG. 2 corresponds to each one of the electric circuits 13 as shown in FIG. 1. According to the example of FIG. 2, the current limiter 13 comprises precisely two MOSFET transistors 13A.1 and 13A.2 connected in series upstream of the at least one electric line 12. The electric line 12 comprises an upper input end IN which is connected with the electric power source 11 and a lower output end OUT which can, for example, be connected with one of the test needles. In addition, to each one of the MOSFET transistors 13A.1 and 13A.2 a diode 13B.1 and 13B.2 can be connected in parallel.

The circuit arrangement, as shown in FIG. 2, furthermore shows in somewhat more detail the voltage source 14, the first DC/DC converter 15, and the second DC/DC converter 16. The voltage source 14 delivers a constant voltage of +12 V to ground. The first DC/DC converter 15 converts the DC voltage down to +5 V to ground (mass terminal GND_ISO) which is then applied to the second DC/DC converter 16 in a galvanically isolated manner. The outputs of the second DC/DC converter 16 are connected with the respective gate terminals of the MOSFET transistors 13A.1 and 13A.2 wherein the mass terminal GND_ISO01 of the second DC/DC converter 16 is connected with the node between the two MOSFET transistors 13A.1 and 13A.2 which are connected source to source with each other. The voltage output of the second DC/DC converter 16 can be +5V and adjustable resistors 17 can be connected between the respective outputs of the second DC/DC converter 16 and the respective gate terminals of the MOSFET transistors 13A.1 and 13A.2. The adjustable resistors 17 allow to adjust the potential applied to the gates such that the voltage applied to the transistors 13A.1 and 13A.2 can be adjusted to any voltage in a range between 0V and 5V. The adjustable resistors 17 thus allow to adjust the magnitude of the limit electric current of the electric circuits 13. Each one of the adjustable resistors 17 can be configured as a single adjustable resistor device or as a combination of active and/or passive electrical devices, in particular a network of resistors providing a desired resistance value.

Figure 3:
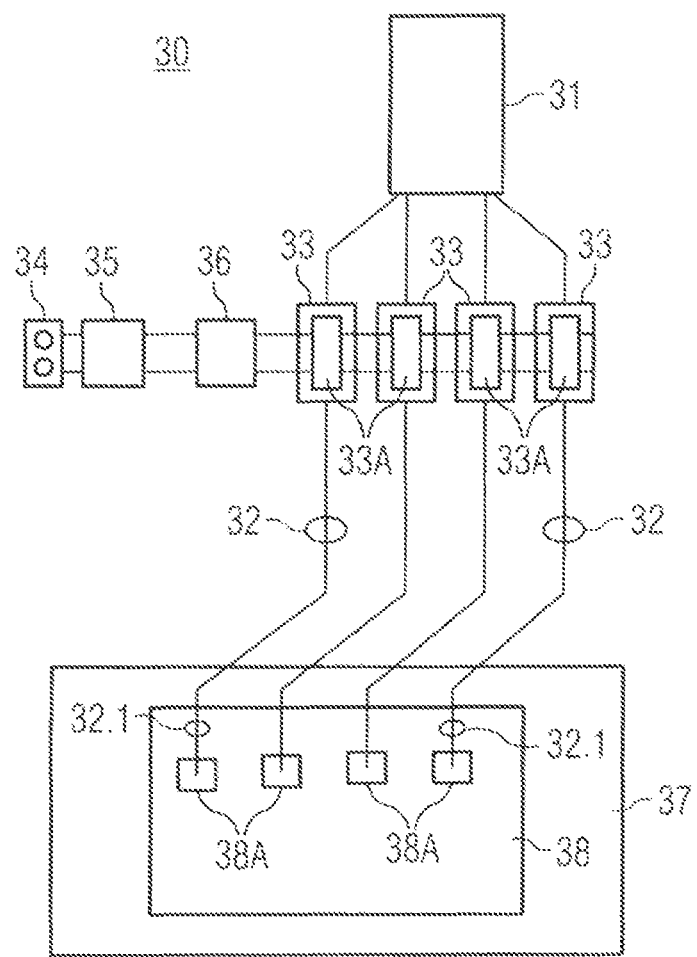
FIG. 3 shows a schematic representation of an electronic de vice for testing of semiconductor components with test needles according to the second aspect.

FIG. 3 shows a schematic representation of an electronic device 30 for testing of semiconductor components with test needles according to a second aspect. The electronic device 30 of FIG. 3 comprises an electric power source 31, a plurality of test needles 32.1 connected with the electric power source 31, and a plurality of electric circuits 33, each one of the electric circuits 33 connected upstream of one of the test needles 32.1, each one of the electric circuits 33 having at least one transistor 33A. The electronic device 30 of FIG. 3 further comprises a control voltage source 34 connected with each one of the electric circuits 33, and two DC/DC converter circuits 35 and 36 connected between the control voltage source 34 and the electric circuits 33.

According to an example of the electronic device 30 of FIG. 3, the two DC/DC converter circuits 35 and 36 are connected with each other in a cascaded manner. According to a further example thereof, the two DC/DC converter circuits 35 and 36 comprise a first DC/DC converter circuit 35 and a second DC/DC converter circuit 36, wherein the first DC/DC converter circuit 35 is connected between the control voltage source 34 and the second DC/DC converter circuit 36, and the second DC/DC converter 36 is connected between the first DC/DC converter circuit 35 and each one of the electric circuits 33. According to a further example thereof, the circuit configuration can be the same as that shown and explained in connection with FIG. 2.

FIG. 3 shows further on a carrier 37 for holding a semiconductor component 38. The semiconductor component 38 can be, for example, a semiconductor chip and the semiconductor component 38 may comprise a plurality of electrical contact pads 38A distributed on a main face of the semiconductor component 38 in a particular manner. According to an example of the electronic device 30 of FIG. 3, the electronic device 30 further comprises a probe card or a needle card (not shown), either one configured to hold the plurality of test needles 32.1, the plurality of test needles 32.1 being disposed in an arrangement geometrically matched to the arrangement of electrical contact pads 38A of the semiconductor component 38. The test needles 32.1 can be connected to electric lines 32 which are connected with the electric power source 31 wherein the electric circuits 33 are connected upstream of the electric lines 32.

Figure 4:
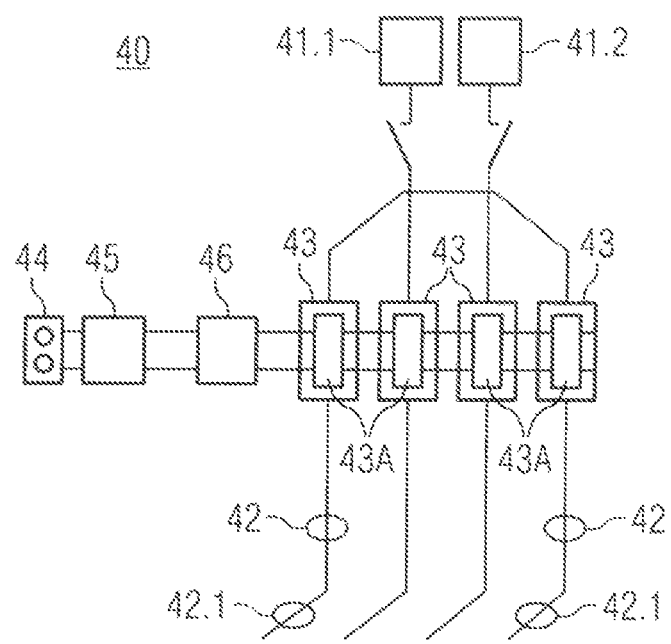
FIG. 4 shows a schematic representation of an electronic de vice for testing of semiconductor components with test needles according to the second aspect, the electronic device comprising first and second electric power sources connectable with the plurality of test needles.

FIG. 4 shows a schematic representation of an electronic device 40 for testing of semiconductor components with test needles according to the second aspect. The electronic device 40 is similar to the electronic devices 10 and 30 as shown and described in connection with FIGS. 1 and 3. In addition, the electronic device 40 comprises two electric power sources 41.1 and 41.2 wherein the first electric power source 41.1 is comprised of a voltage source and the second electric power source 41.2 is comprised of a current source. The first electric power source 41.1 may, for example, provide a maximum voltage of 2500 V and the second electric power source 41.2 may, for example, provide a maximum current of 100 A. Each one of the first and second electric power sources 41.1 and 41.2 is connected with the plurality of electric lines 42 and thus with the plurality of test needles 42.1 by means of a switch so that one of the electric power sources 41.1 and 41.2 can be selectively connected with the test needles 42.

The reference signs 43, 43A, 44, 45, and 46 refer to the electric circuit, the transistor, the voltage source, the first DC/DC converter, and the second DC/DC converter 46 and have the same properties and functionalities as the respective devices shown and described in the previous examples of FIGS. 1 to 3.

According to an example of the forth aspect, in the examples as shown and described in FIGS. 1 to 3 it is possible to omit one of the DC/DC converters and to connect one single DC/DC converter between the voltage source and the electric current limiter circuit and to connect an adjustable resistor between the DC/DC converter and the electric current limiter circuit such as that shown and described in connection with FIG. 2.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic device for distributing electric current to a plurality of current paths, the electronic device comprising:
    an electric power source;
    at least one electric line connected with the electric power source;
    at least one electric circuit connected upstream of the at least one electric line, the at least one electric circuit comprising at least one circuit component which has low resistance in a range of electric currents and has high resistance above a given limit electric current; and
    a control voltage source connected with the at least one electric circuit; and
    a first DC/DC converter circuit and a second DC/DC converter circuit, wherein the first DC/DC converter circuit is connected between the control voltage source and the second DC/DC converter circuit, and the second DC/DC converter circuit is connected between the first DC/DC converter circuit and the at least one electric circuit.

2. The electronic device of claim 1, wherein the electric power source is a voltage source or a current source.

3. The electronic device of claim 1, wherein the at least one electric line comprises a test needle configured to be placed onto an electrical contact pad of a semiconductor component.

4. The electronic device of claim 3, further comprising:
    a probe card or needle card, either one comprising a plurality of test needles in an arrangement geometrically matched to an arrangement of electrical contact pads of the semiconductor component.

5. The electronic device of claim 1, wherein the at least one circuit component comprises a MOSFET transistor.

6. The electronic device of claim 5, wherein the limit electric current is determined by the saturation of a drain current of the MOSFET transistor.

7. The electronic device of claim 5, further comprising:
    a diode connected in parallel to the MOSFET transistor.

8. The electronic device of claim 1, wherein the at least one circuit component comprises a single MOSFET transistor connected upstream of the at least one electric line.

9. The electronic device of claim 1, wherein the at least one circuit component comprises only two MOSFET transistors connected in series upstream of the at least one electric line.

10. An electronic device for testing of semiconductor components with test needles, the electronic device comprising:
    an electric power source;
    a plurality of test needles connected with the electric power source;
    a plurality of electric circuits, each one of the electric circuits connected upstream of one of the test needles, each one of the electric circuits comprising at least one transistor;
    a control voltage source connected with each one of the electric circuits; and
    two DC/DC converter circuits connected between the control voltage source and the electric circuits.

11. The electronic device of claim 10, wherein the two DC/DC converter circuits are connected with each other in a cascaded manner.

12. The electronic device of claim 10, wherein the two DC/DC converter circuits comprise a first DC/DC converter circuit and a second DC/DC converter circuit, wherein the first DC/DC converter circuit is connected between the control voltage source and the second DC/DC converter circuit, and wherein the second DC/DC converter circuit is connected between the first DC/DC converter circuit and each one of the electric circuits.

13. The electronic device of claim 10, wherein the electric power source comprises a first electric power source configured as a current source and a second electric power source configured as a voltage source, wherein each one of the first electric power source and the second electric power source is connected via a switch with the plurality of test needles.

14. The electronic device of claim 10, further comprising:
    an adjustable resistor connected between the control voltage source and the at least one circuit component.

15. A test apparatus for testing of semiconductor components, the test apparatus comprising:
    a carrier for supporting a semiconductor component to be tested;
    an electric power source;
    a plurality of test needles connected with the electric power source;
    a plurality of electric circuits, each one of the electric circuits connected upstream of one of the test needles, each one of the electric circuits comprising at least one transistor;
    a control voltage source connected with each one of the electric circuits; and
    two DC/DC converter circuits connected between the control voltage source and the electric circuits.

16. Test apparatus of claim 15, further comprising:
    a probe card or needle card, either one configured to hold the plurality of test needles, the plurality of test needles being disposed in as arrangement geometrically matched to an arrangement of electrical contact pads of the semiconductor component.

17. Test apparatus of claim 15, wherein the two DC/DC converter circuits are connected with each other in a cascaded manner.

\* \* \* \* \*